(12) United States Patent
Strauβ et al.

(10) Patent No.: US 9,373,937 B2
(45) Date of Patent: Jun. 21, 2016

(54) SEMICONDUCTOR LASER WITH IMPROVED CURRENT CONDUCTION

(71) Applicant: OSRAM Opto Semiconductors GmbH, Regensburg (DE)

(72) Inventors: Uwe Strauβ, Bad Abbach (DE); Teresa Wurm, Regensburg (DE); Adrian Stefan Avramescu, Regensburg (DE); Georg Brüderl, Burglengenfeld (DE); Christoph Eichler, Tegernheim (DE); Sven Gerhard, Thalmassing (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/430,685

(22) PCT Filed: Sep. 3, 2013

(86) PCT No.: PCT/EP2013/068176
§ 371 (c)(1),
(2) Date: May 19, 2015

(87) PCT Pub. No.: WO2014/048687
PCT Pub. Date: Apr. 3, 2014

(65) Prior Publication Data
US 2015/0255956 A1     Sep. 10, 2015

(30) Foreign Application Priority Data

Sep. 27, 2012  (DE) .......................... 10 2012 217 662
Nov. 15, 2012  (DE) .......................... 10 2012 220 911

(51) Int. Cl.
*H01S 5/20*     (2006.01)
*H01S 5/22*     (2006.01)
(Continued)

(52) U.S. Cl.
CPC ............. *H01S 5/2031* (2013.01); *H01S 5/2009* (2013.01); *H01S 5/22* (2013.01);
(Continued)

(58) Field of Classification Search
CPC . H01S 5/2031; H01S 5/34333; H01S 5/2205; H01S 5/22; H01S 5/32341; H01S 5/3063; H01S 5/2009; H01S 5/3215; H01S 5/209; H01S 5/3211
See application file for complete search history.

(56) References Cited

U.S. PATENT DOCUMENTS 8,565,278 B2    10/2013  Eichler et al.
8,897,329 B2 *  11/2014  Sizov .................... B82Y 20/00
                                                        372/45.01

(Continued)

FOREIGN PATENT DOCUMENTS

DE     102008021674 A1    10/2009
JP          200091705 A     3/2000
(Continued)

*Primary Examiner* — Dung Nguyen
(74) *Attorney, Agent, or Firm* — Slater Matsil, LLP

(57) ABSTRACT

A semiconductor laser includes a layer structure with superimposed layers with at least the following layer structure: an n-doped outer layer, a third wave-guiding layer, an active zone in which light-generating structures are arranged, a second wave-guiding layer, a blocking layer, a first wave-guiding layer, a p-doped outer layer. The first, second and third wave-guiding layers have at least $Al_xIn_yGa(1-x-y)N$. The blocking layer has an Al content which is at least 2% greater than the Al content of the adjacent first wave-guiding layer. The Al content of the blocking layer increases from the first wave-guiding layer towards the second wave-guiding layer. The layer structure has a double-sided gradation. The double-side gradation is arranged at the height of the blocking layer such that at least one part of the blocking layer or the entire blocking layer is of greater width than the first wave-guiding layer.

20 Claims, 8 Drawing Sheets

(51) Int. Cl.
*H01S 5/323* (2006.01)
*H01S 5/30* (2006.01)
*H01S 5/343* (2006.01)
*H01S 5/32* (2006.01)
*H01S 5/40* (2006.01)

(52) U.S. Cl.
CPC ............ *H01S 5/2205* (2013.01); *H01S 5/3063* (2013.01); *H01S 5/3215* (2013.01); *H01S 5/32341* (2013.01); *H01S 5/34333* (2013.01); *H01S 5/209* (2013.01); *H01S 5/3211* (2013.01); *H01S 5/4031* (2013.01)

(56) References Cited

U.S. PATENT DOCUMENTS

| | | |
|---|---|---|
| 2002/0053676 A1 | 5/2002 | Kozaki |
| 2004/0151225 A1 | 8/2004 | Sato |
| 2004/0184497 A1* | 9/2004 | Kneissl ................. B82Y 20/00 372/45.01 |
| 2005/0032344 A1 | 2/2005 | Hatano et al. |
| 2007/0195846 A1 | 8/2007 | Hasegawa et al. |
| 2008/0137701 A1 | 6/2008 | Freund |
| 2008/0298414 A1 | 12/2008 | Choi |
| 2010/0195687 A1 | 8/2010 | Okamoto et al. |
| 2011/0075694 A1 | 3/2011 | Yoshizumi et al. |
| 2011/0272667 A1 | 11/2011 | Takayama |
| 2012/0112204 A1 | 5/2012 | Kyono et al. |
| 2012/0140785 A1 | 6/2012 | Nakagawa et al. |
| 2012/0140786 A1* | 6/2012 | Matschullat .......... C21B 13/125 373/18 |

FOREIGN PATENT DOCUMENTS

| | | |
|---|---|---|
| JP | 2000151023 A | 5/2000 |
| TW | 200306042 | 11/2003 |
| TW | 200423503 A | 11/2004 |
| TW | 201112550 | 4/2011 |
| TW | 201134038 A | 10/2011 |

* cited by examiner

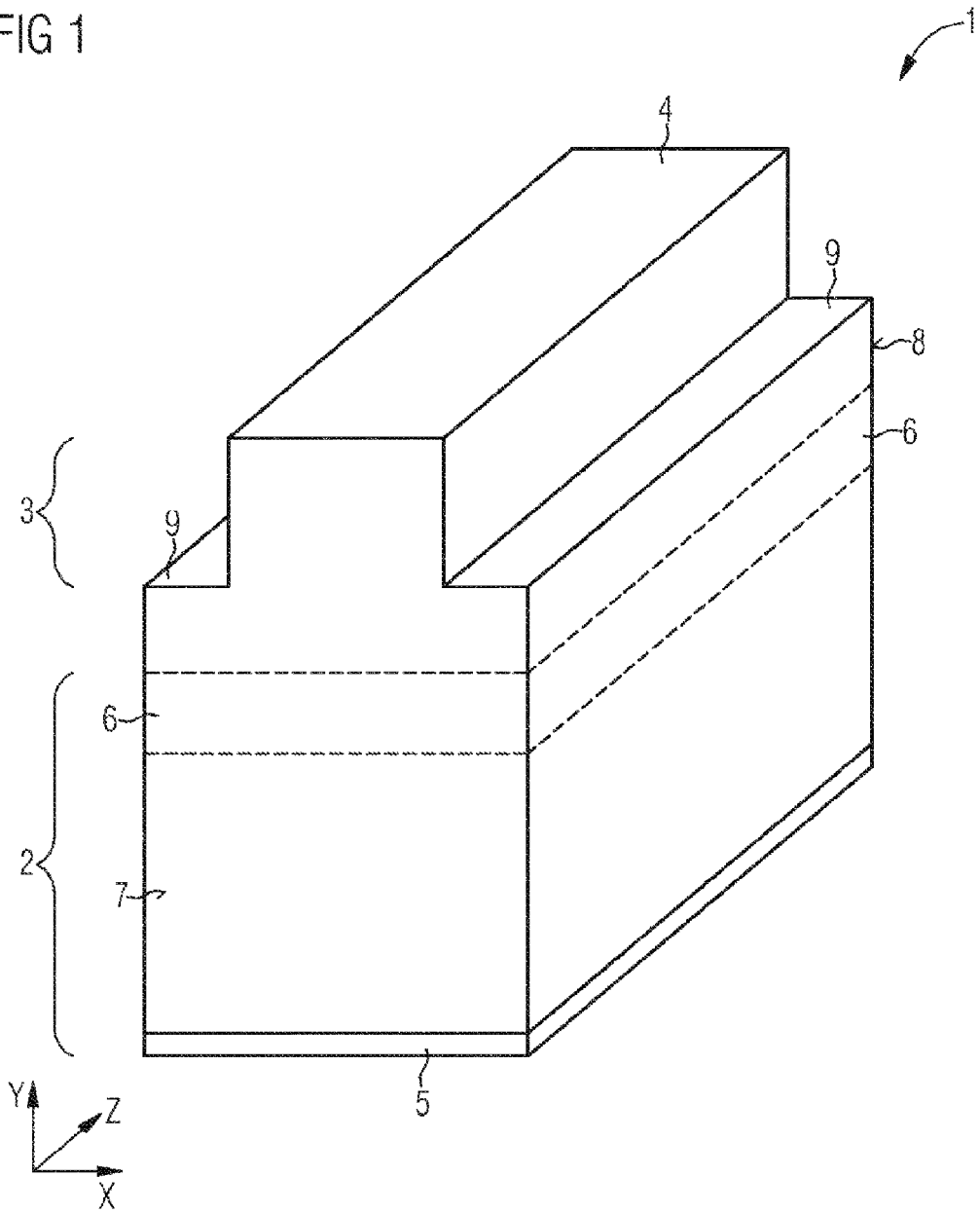

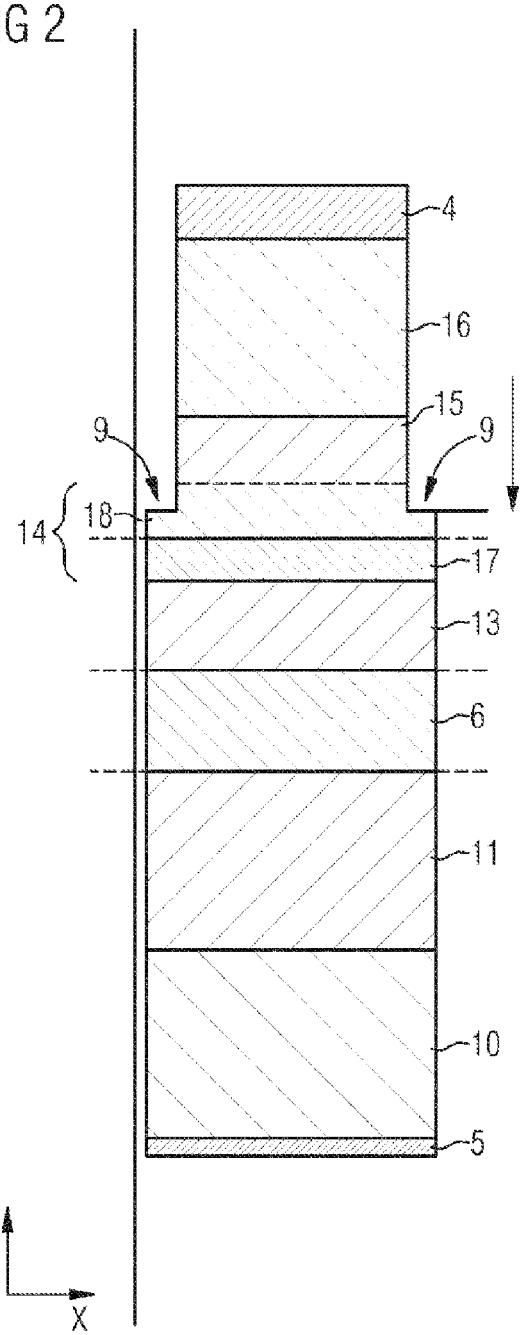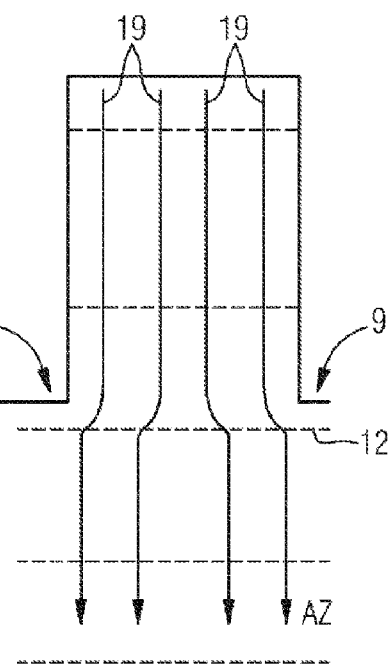

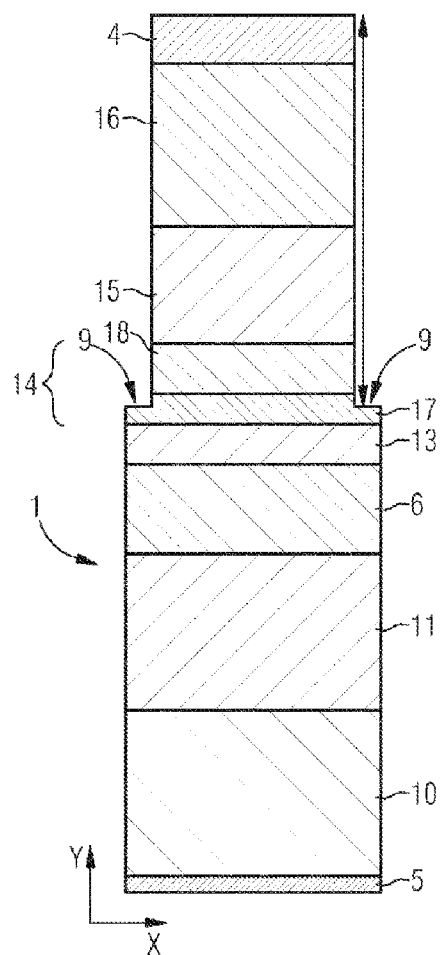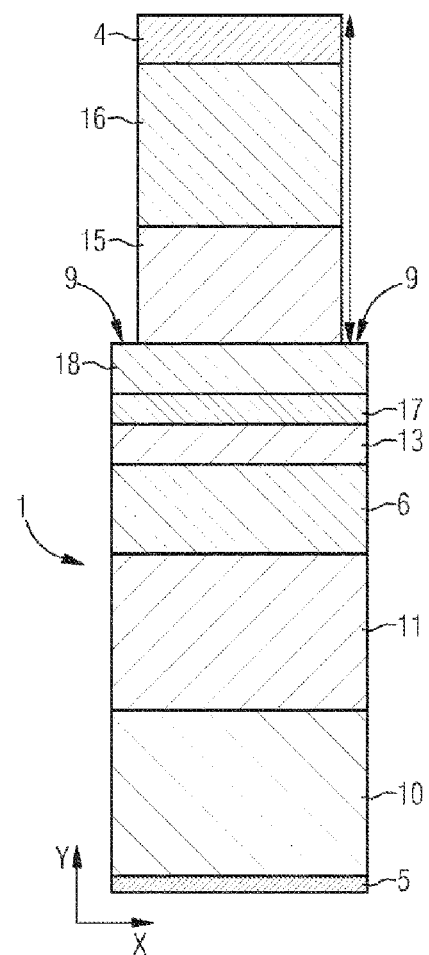

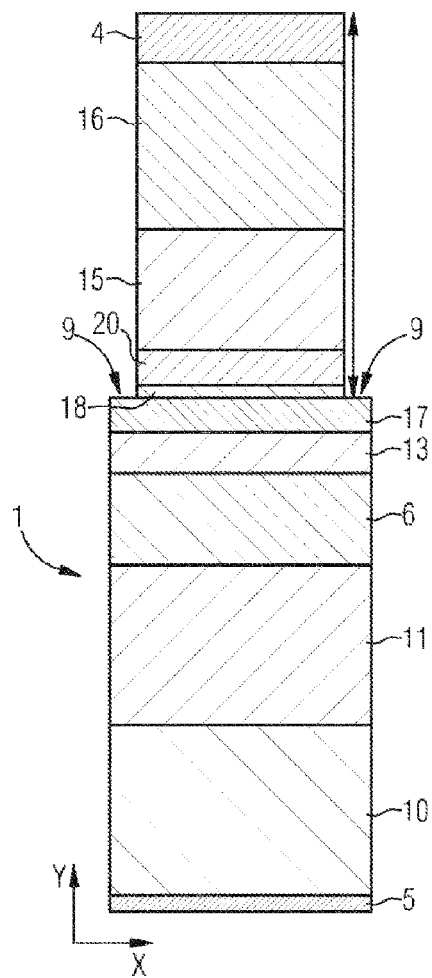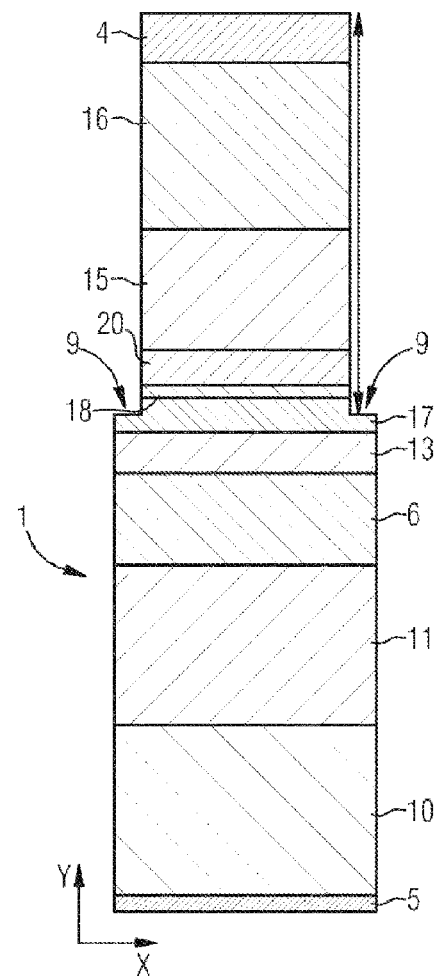

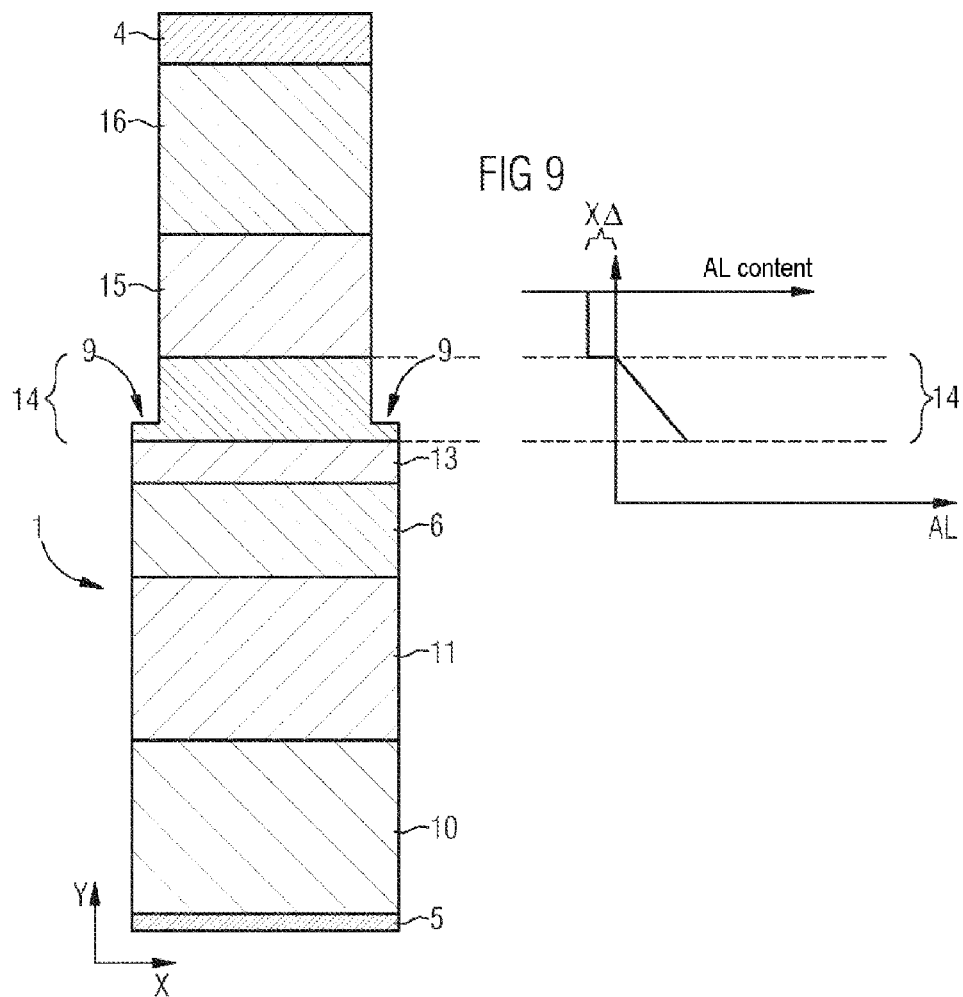

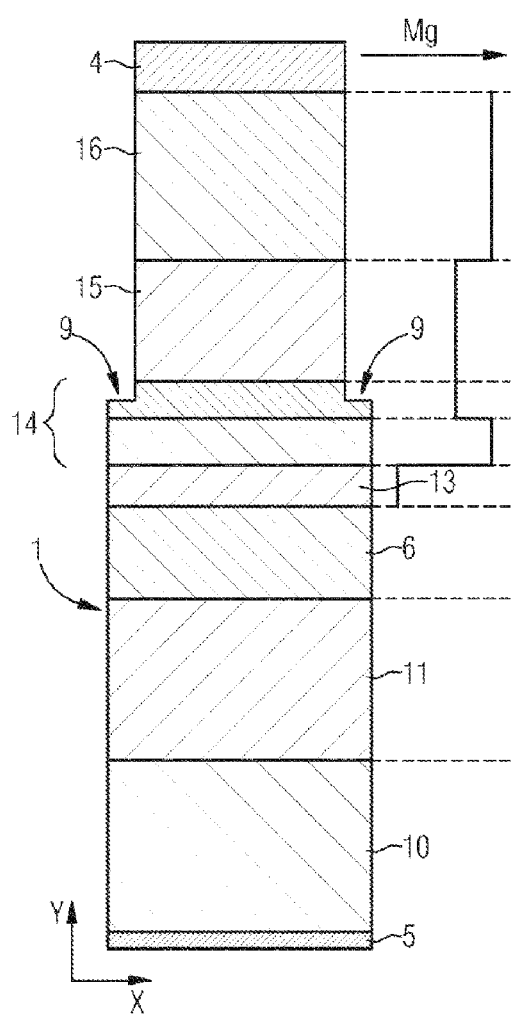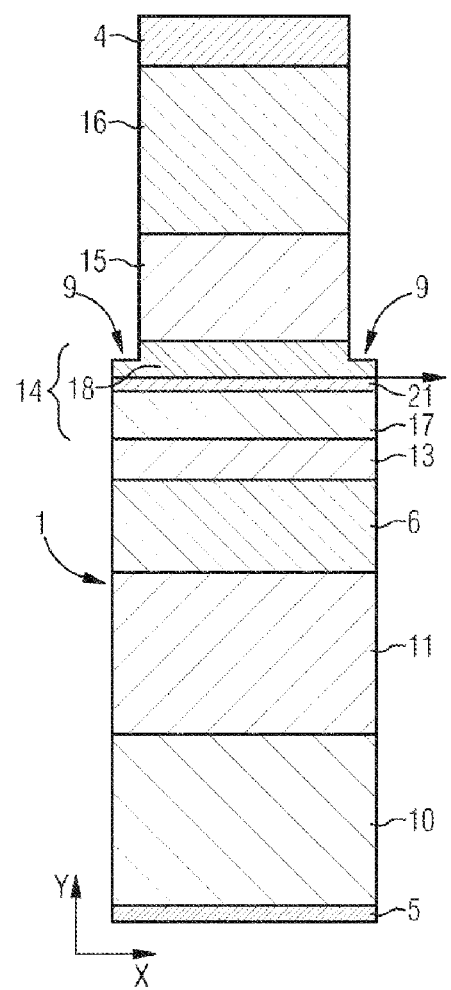

SEMICONDUCTOR LASER WITH IMPROVED CURRENT CONDUCTION

This patent application is a national phase filing under section 371 of PCT/EP2013/068176, filed Sep. 3, 2013, which claims the priority of German patent application 10 2012 217 662.4, filed Sep. 27, 2012 and German patent application 10 2012 220 911.5, filed Nov. 15, 2012, each of which is incorporated herein by reference in its entirety.

TECHNICAL FIELD

The invention relates to a semiconductor laser and a method for producing a semiconductor laser.

BACKGROUND

The prior art discloses an edge emitting semiconductor laser having a ridge waveguide geometry. The semiconductor laser is preferably produced from a III-V semiconductor material. The semiconductor laser is constructed in the form of layers arranged in an X-Z-plane. The layers are arranged one above another along a Y-axis. In the Y-Z-plane, the semiconductor laser has a stepped graduation from a narrower upper region toward a wider lower region. The layer sequence of the semiconductor laser comprises a P-type cladding layer, a waveguide, an active zone and a second waveguide and a second cladding layer. The stepped graduation is embodied in a manner adjoining the upper waveguide.

SUMMARY

One embodiment of the semiconductor laser has the advantage that improved current conduction is achieved by virtue of the attenuation of a two-dimensional charge carrier gas in the region of the blocking layer. Moreover, a current constriction is additionally supported on account of the arrangement of the stepped graduation of the layer structure in a manner at least adjoining the blocking layer. Consequently, the stepped graduation can be arranged on the top side of the blocking layer or in the blocking layer. Furthermore, contrary to expectations, the performance of the semiconductor laser is improved by the provision of the first waveguide in combination with the stepped graduation. Consequently, in comparison with the prior art, an increased current density is achieved in the active zone.

The current constriction is also supported by the fact that in the blocking layer the aluminum concentration increases in the direction of the second waveguide layer, i.e., in the direction of the active zone.

The arrangement described can be used to improve laser data of a semiconductor laser, in particular the threshold and the slope. This is achieved by optimizing an injection efficiency of the charge carriers into the semiconductor structure, i.e., the active zone. This avoids a situation in which the mobile electrons reach positively doped regions and recombine there non-radiatively.

With the aid of the blocking layer described, an excessively great jump in the aluminum concentration is avoided, thereby reducing the formation of a two-dimensional hole gas at the interface between a waveguide layer and the blocking layer. The high transverse conductivity of the holes in the two-dimensional hole gas leads to the disadvantage that current spreading into lateral edge regions is the consequence. These advantages are achieved for polar and non-polar layers.

With the aid of the improved layer sequence and the arrangement of the stepped graduation adapted thereto, an improvement in the hole injection efficiency is achieved, a good electron injection efficiency being maintained.

In a further embodiment, as a result of the introduction of a plurality of layers having different aluminum concentrations instead of an individual layer having a very high aluminum concentration, the blocking layer is fashioned in such a way that the hole transport in the active zone is improved and the occurrence of pronounced two-dimensional hole gases is reduced or prevented. By way of example, the blocking layer can comprise AlGaN, AlInGaN or AlInN; in particular, the blocking layer can be embodied as an AlGaN layer and/or as an AlInGaN layer and/or as an AlInN layer.

The increase in the aluminum concentration coming from the p-doped side in the direction of the active zone yields a plurality of small barriers or a rising barrier for the holes. As a result, the transport of the holes is facilitated by the stepped or rising increase in the aluminum concentration. Furthermore, the height of the band edge jumps and thus the manifestation of the two-dimensional hole gas decreases as a result.

In one embodiment, the blocking layer is embodied in the form of a first and a second blocking layer, wherein the aluminum concentration differs in the two blocking layers, wherein, in the blocking layer facing the second waveguide layer, the aluminum concentration is at least 1% greater than in the second blocking layer. The embodiment of blocking layers having different aluminum concentrations results in a defined attenuation of the two-dimensional charge carrier gas in the blocking layer.

Depending on the embodiment chosen, the aluminum concentration in the blocking layer can have a maximum value of 30%. A great attenuation of the two-dimensional hole gas is achieved as a result.

Depending on the embodiment chosen, the two-side stepped graduation is arranged closer to the first waveguide layer or nearer to the second waveguide layer, but adjoining or within the blocking layer. The nearer the stepped graduation is to the second waveguide layer, i.e., nearer to the active zone, the greater the current constriction is and thus the current density in the active zone is all the higher.

In a further embodiment, the blocking layer is embodied as an integral layer, wherein the aluminum concentration increases proceeding from the first waveguide layer in the direction of the second waveguide layer. The increase can be embodied linearly, for example. Moreover, the increase provided in the aluminum concentration in the direction of the second waveguide layer can be an increase greater than the linear increase. By virtue of the type of increase in the aluminum concentration and the value of the aluminum concentration, the current constriction can be set individually. Moreover, an adapted constriction of the current density in the active zone can also be achieved by means of the position of the stepped graduation in the region of the blocking layer.

In a further embodiment, the first and second blocking layers and the first and second waveguides are positively doped, wherein an average doping concentration is chosen in such a way that the average doping concentration of the first blocking layer is greater than the average doping concentration of the second blocking layer, wherein the average doping concentration of the first waveguide layer is chosen to be greater than or equal to the doping concentration of the second blocking layer. Moreover, the doping concentration of the second waveguide layer is less than the doping concentration of the first waveguide layer. By way of example, the second waveguide layer can also be undoped. In a further embodiment, the average doping concentration of the first blocking layer is greater than the average doping concentration of the second blocking layer. Moreover, the average doping concentration of the second blocking layer is greater than the average doping concentration of the first waveguide layer. Furthermore, the average doping concentration of the first waveguide layer is greater than the average doping concentration of the second waveguide layer. Magnesium, for example, can be used as dopant.

In a further embodiment, the doping concentration of the p-type cladding layer is greater than the doping concentration of the first waveguide layer. Furthermore, steps of the doping concentration or gradients of the doping concentration are possible within the individual layers depending on the embodiment chosen. The absorption of the optical mode of the light generated by the active zone becomes smaller as a result of the decrease in the doping concentration.

Depending on the embodiment chosen, at least one additional layer can be provided between the first and second waveguide layers. The additional layer can be provided between the first and second blocking layers, for example. The additional layer can consist of gallium nitride, for example, and support or at least not impair the function of the semiconductor laser.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings, wherein FIG. 1 shows a schematic perspective illustration of the semiconductor laser;

FIG. 2 shows a schematic cross-sectional illustration of one embodiment of the semiconductor laser;

FIG. 3 shows a schematic illustration of the current conduction of the semiconductor laser from FIG. 2;

FIGS. 4 and 5 show further embodiments of a semiconductor laser comprising two blocking layers and different height positions of the double-side stepped graduation;

FIGS. 6 and 7 show further embodiments of the semiconductor laser comprising a plurality of blocking layers;

FIG. 8 shows one embodiment of the semiconductor laser comprising a blocking layer having an aluminum gradient;

FIG. 9 shows a schematic illustration of the aluminum gradient;

FIG. 10 shows a schematic illustration of a semiconductor laser with indication of the magnesium doping of the individual layers;

FIG. 11 shows a further embodiment of a semiconductor laser comprising an intermediate layer between the first and second waveguide layers.

DETAILED DESCRIPTION OF ILLUSTRATIVE EMBODIMENTS

Figure 12:
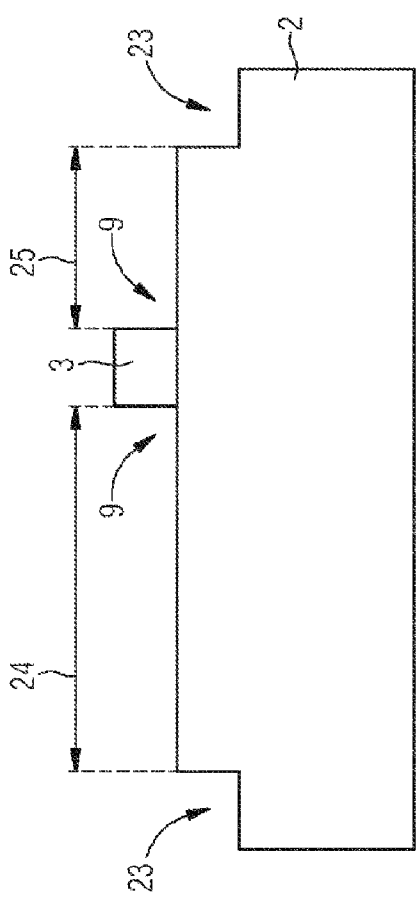
FIGS. 12 to 15 show further embodiments of the semiconductor laser.

FIG. 1 illustrates the coordinate system of the X-, Y-, Z-axes, the axes in each case being perpendicular to one another. FIG. 1 shows a schematic, perspective illustration of a semiconductor laser 1 having a main body 2 and a stepped attachment 3. The semiconductor laser 1 is constructed in the form of layers arranged in Z-X-planes, wherein the layers are arranged one above another along a Y-axis. The attachment 3 terminates with a p-type contact layer 4, wherein the main body 2 terminates opposite with an n-type contact layer 5. An active zone 6 is arranged in the main body 2 between the p-type contact layer 4 and the n-type contact layer 5, said active zone being designed to generate light. The active zone 6 extends in a lateral direction along the Z-axis. A first and a second resonator mirror are arranged at opposite side surfaces 7, 8. The attachment 3 merges via a double-side stepped graduation 9 in the X-axis into the main body 2, which is embodied such that it is wider in the X-axis. The laser light is coupled out via one of the two resonator minors.

FIG. 2 shows a schematic cross section through the semiconductor laser 1 in the Y-X-plane. An n-doped cladding layer 10 is adjacent to the n-type contact layer 5. A third waveguide layer 11 is arranged on the n-doped cladding layer 10. The active zone 6 is applied on the third waveguide layer 11. A second waveguide layer 13 is arranged on the active zone 6. A blocking layer 14 is applied on the second waveguide layer 13. A first waveguide layer 15 is arranged on the blocking layer 14. A p-type cladding layer 16 is arranged on the first waveguide layer 15. The p-type contact layer 4 is applied on the p-type cladding layer 16. In the exemplary embodiment illustrated, the blocking layer 14 is embodied in the form of a first blocking layer 17 and a second blocking layer 18. The first and second blocking layers 17, 18 differ at least in the band gap, which is influenced, for example, by the aluminum concentration. The first blocking layer 17 faces the second waveguide layer 13 and in particular is applied on the second waveguide layer. The second blocking layer 18 faces the first waveguide layer 15 and is embodied, for example, in a manner directly adjoining the first waveguide layer 15 and the first blocking layer 17. The n- and p-doped cladding layers comprise gallium and nitrogen, AlInGaN, AlGaN or AlInN and are constructed as AlInGaN layers, for example.

The first, second and third waveguide layers 15, 13, 11 can differ in their composition. The first and/or the second and/or the third waveguide layer comprise(s) $Al_xIn_yGa_{(1-x-y)}N$, wherein x can assume values of between 0 and 1, wherein y can assume values of between 0 and 1, and wherein the sum (x+y) can assume values of between 0 and 1.

Moreover, the waveguide layers 15, 13, 11 on average have a greater refractive index than the p-type cladding layer 16 or the n-type cladding layer 10. Good properties are achieved with a first waveguide layer 15 having a thickness of between 0 nm and 300 nm. Better properties are achieved with a first waveguide layer 15 having a thickness of between 20 nm and 200 nm. Even better properties are achieved with a first waveguide layer 15 having a thickness of between 40 nm and 100 nm. The first waveguide layer 15 is constructed from $Al_xIn_yGa_{1-x-y}N$, wherein x can be between 0% and 20%. In a further embodiment, x can be between 0% and 6%. In a further embodiment, x can be between 0% and 3%. Y can assume values of between 0% and 10%.

The second waveguide layer 13 is embodied in a manner constructed from $Al_xIn_yGa_{1-x-y}N$ and has a thickness of between 3 nm and 300 nm, for example. x can assume the values of between 0% and 5% and y can assume the values of between 0% and 12%. By way of example, x can assume the values of between 0% and 2% and y can assume the values of between 0% and 7%.

The blocking layer 14 constitutes an aluminum-containing layer. The blocking layer 14 can be embodied in a multilayered fashion with different aluminum concentrations in individual layers or as a single layer having a gradient of aluminum concentration or in a combination comprising a plurality of layers having different aluminum concentrations and at least one layer having an aluminum gradient. The aluminum concentration of the blocking layer 14 is greater than the aluminum concentration of the first waveguide layer 15. By way of example, the aluminum concentration of the blocking layer in the region adjoining the first waveguide layer 15 is at least 2% greater than the aluminum concentration of the first waveguide layer 15. Depending on the embodiment chosen, the aluminum concentration of the blocking layer 14 adjoining the first waveguide layer 15 can be at least 4% greater than the aluminum concentration of the first waveguide layer 15. The blocking layer 14 can comprise an aluminum gallium nitride layer, an aluminum indium gallium nitride layer and/or an aluminum indium nitride layer. Moreover, the blocking layer 14 can be embodied as an AlGaN layer or as an AlInGaN layer or as an AlInN layer. The proportion of indium can be less than 20%, preferably less than 5%, wherein the thickness of the blocking layer 14 can be between 10 nm and 100 nm, for example. Depending on the embodiment chosen, the blocking layer 14 can have a thickness of between 20 nm and 60 nm.

In the case of an embodiment of the blocking layer 14 in the form of a first blocking layer 17 and in the form of a second blocking layer 18, the first blocking layer 17 has a greater average aluminum concentration than the second blocking layer 18. The aluminum concentrations of the first and second blocking layers differ, for example, by 1% or by more, e.g., by 6% or by 15%. Moreover, the second blocking layer 18 in this embodiment can assume the abovementioned values for the blocking layer 14. The height position of the two-side stepped graduation 9 is arranged in a manner at least adjoining the blocking layer 14 and in particular within the blocking layer 14. In the exemplary embodiment in FIG. 2, the stepped graduation 9 is arranged in the region of the second blocking layer 18.

FIG. 3 shows a current conduction 19 from the p-type contact 4 in the direction of the n-type contact 5 in a schematic illustration in the form of arrows. The arrangement of the blocking layer 14 having an increased aluminum concentration compared with the first waveguide layer 15 and additionally having a stepped increase in the aluminum concentration or an increasing-gradient of the aluminum concentration results in a constriction of the current flow 19 that takes effect in the direction of the active zone 6, said current flow being illustrated in the form of arrows. As a result of the arrangement of the stepped graduation 9 and the advantageously embodied blocking layer 14, an attenuated two-dimensional hole gas 12 is produced within the blocking layer 14. The hole gas 12 is depicted schematically in the form of dotted lines in FIG. 3.

FIG. 4 shows, in a schematic illustration, a cross section of the X-Y-plane through a further embodiment of the semiconductor laser 1, which is embodied substantially in accordance with the embodiment in FIG. 2, but wherein the stepped graduation 9 is arranged deeper in comparison with FIG. 2 and is formed in the region of the first blocking layer 17.

FIG. 5 shows a further embodiment of the semiconductor laser, which is embodied substantially in accordance with the embodiment in FIG. 2, but wherein the stepped graduation 9 is arranged at an upper edge of the second blocking layer 18 in the boundary region between the first waveguide layer 15 and the second blocking layer 18.

FIG. 6 shows, in a schematic illustration, a cross section in the X-Y-plane of a further embodiment of a semiconductor laser, which is embodied substantially in accordance with the arrangement in FIG. 2, but wherein, in contrast to the arrangement in FIG. 2, a first, a second and a third blocking layer 17, 18, 20 are provided instead of a first and a second blocking layer 17, 18. The three blocking layers have different aluminum concentrations, for example, wherein the aluminum concentration of the third blocking layer 20 is less than that of the second blocking layer 18 and the aluminum concentration of the second blocking layer 18 is less than the aluminum concentration of the first blocking layer 17. The first blocking layer 17 has a maximum aluminum concentration of 30%, for example. Furthermore, the aluminum concentration of the third blocking layer 20 is at least 2% higher than the aluminum concentration of the first waveguide layer 15. Preferably, the aluminum concentration of the third blocking layer 20 is at least 4% greater than the aluminum concentration of the first waveguide layer 15. In the exemplary embodiment in FIG. 6, the stepped graduation 9 is arranged in the boundary region between the first and second blocking layers 17, 18.

FIG. 7 shows a further embodiment, which is embodied substantially in accordance with an embodiment in FIG. 6, but wherein the stepped graduation 9 is arranged in the region of the first blocking layer 17, in particular at half the height of the first blocking layer 17. Depending on the embodiment chosen, it is also possible to provide more than three blocking layers having a different and/or identical aluminum concentration. The first blocking layer 17 can have a thickness of, for example, between 40 nm and 60 nm, in particular 50 nm, for example. The stepped graduation 9 can be arranged at a depth of between 0 and 30 nm of the first blocking layer, for example, at a depth of 20 nm.

FIG. 8 shows, in a schematic illustration, a cross section through an X-Y-plane of a further embodiment of a semiconductor laser, which is embodied substantially in accordance with the arrangement in FIG. 2, but wherein the blocking layer 14 is embodied as an integral blocking layer, which has, proceeding from the first waveguide layer 15 in the direction of the second waveguide layer 13, an aluminum concentration that increases in the direction of the second waveguide layer 13. FIG. 9 shows, in a schematic illustration, the increase in the aluminum concentration in the direction of the second waveguide layer 13 within the blocking layer 14. Furthermore, the blocking layer 14 has, in the boundary region with respect to the first waveguide layer 15, at least an aluminum concentration which is 2% greater than the aluminum concentration of the first waveguide layer 15. Moreover, in a further embodiment, the blocking layer 14, in the boundary region with respect to the first waveguide layer 15, can already have an aluminum concentration which is at least 4% greater than the aluminum concentration of the first waveguide layer 15. In the exemplary embodiment illustrated, the aluminum concentration increases linearly in the direction of the second waveguide layer 13, as illustrated in FIG. 9. Depending on the embodiment chosen, the aluminum concentration can also increase discontinuously or exponentially in the direction of the second waveguide layer 13. In the example illustrated, the stepped graduation 9 is formed in a lower third of the blocking layer 14.

FIG. 10 shows, in a schematic illustration, a cross section through the X-Y-plane of the semiconductor laser 1 from FIG. 2, wherein an example of the magnesium doping of the p-type cladding layer, of the first waveguide layer 15, of the first and second blocking layers 17, 18 and of the second waveguide layer 13 is additionally indicated.

In a further embodiment, the first and second blocking layers and the first and second waveguide layers are p-doped with magnesium, wherein an average magnesium concentration is chosen in such a way that the average magnesium concentration of the first blocking layer is greater than the average magnesium concentration of the second blocking layer, wherein the average magnesium concentration of the first waveguide layer is chosen to be greater than or equal to the magnesium concentration of the second blocking layer. Moreover, the magnesium concentration of the second waveguide layer is less than the magnesium concentration of the first waveguide layer. The second waveguide layer can also be undoped.

In a further embodiment, the magnesium concentration of the p-type cladding layer is greater than the magnesium concentration of the first waveguide layer. Furthermore, depending on the embodiment chosen, steps of the magnesium concentration or gradients of the magnesium concentration are possible within the individual layers. The absorption of the optical mode becomes smaller as a result of the decrease in the Mg concentration. The doping with magnesium is in the range of $1*10^{17}$-$5*10^{20}/[1/cm^3]$, preferably between $1*10^{17}$-$5*10^{19}/[1/cm^3]$. Instead of magnesium, it is also possible, for example, to use carbon, beryllium, zinc, cadmium or calcium as dopant.

FIG. 11 shows, in a schematic illustration, a cross section in the X-Y-plane of a further embodiment of a semiconductor laser, which is embodied substantially in accordance with the embodiment in FIG. 2. However, in addition to the embodiment in FIG. 2, an intermediate layer 21 is formed between the first and second blocking layers 17, 18. The intermediate layer 21 can, for example, comprise gallium nitride, or consist of gallium nitride. Depending on the embodiment chosen, the intermediate layer 21 can have a layer thickness of less than 20 nm, for example.

Moreover, the intermediate layer 21 can also be arranged between the first waveguide layer 15 and the second blocking layer 18 and/or between the second waveguide layer 13 and the first blocking layer 17. Depending on the embodiment chosen, it is also possible for a plurality of intermediate layers 21 to be provided between the first and second waveguide layers 15, 13. Moreover, corresponding intermediate layers can also be arranged within an integral blocking layer 14 having an aluminum gradient. The stepped graduation 9 is introduced into the semiconductor laser, for example, by means of the corresponding edge regions being etched away. In this case, the height of the stepped graduation 9 is attained by means of the times or else by means of a signal identification of the composition of the etched layer. In this case, the etching rates depend on the composition of the layer and on the etching process used.

Dry-chemical removal methods such as, e.g., reactive ion etching (RIE) or chemically assisted ion beam etching (CAIBE) can be used for introducing the stepped graduation 9.

The active zone can comprise, for example, quantum well structures in the form of alternating indium gallium nitride layers and gallium nitride layers. However, it is also possible to use other types of active zones for generating light.

Although the invention has been more specifically illustrated and described in detail by means of the preferred exemplary embodiment, nevertheless the invention is not restricted by the examples disclosed, and other variations can be derived therefrom by the person skilled in the art, without departing from the scope of protection of the invention.

FIG. 12 shows a further embodiment of a semiconductor laser, wherein in addition to the stepped graduation 9 laterally with respect to the attachment 3 a further blocking layer 23 is provided on the top side of the main body 2. The distances between the attachment 3 and the further stepped graduation of the further blocking layer 23 can be of different magnitudes on both sides. The distances can be embodied in the range of greater than 0.1 μm, for example, greater than 2 μm, preferably greater than 10 μm. The arrangement in FIG. 12 schematically illustrates an example which can constitute a ridge laser with mesa trench.

Figure 13:
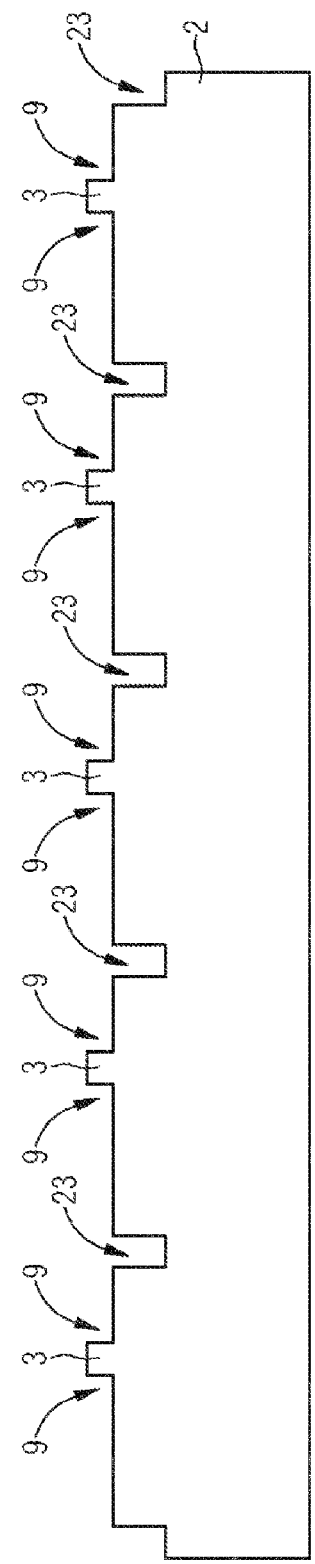

FIG. 13 shows an example of a laser bar comprising a plurality of semiconductor lasers arranged alongside one another, wherein a main body can have a plurality of attachments 3 with corresponding stepped graduations 9 and further stepped graduations 23 situated therebetween. The further stepped graduations 23 constitute so-called mesa trenches. An attachment 3 represents a semiconductor laser.

Figure 14:
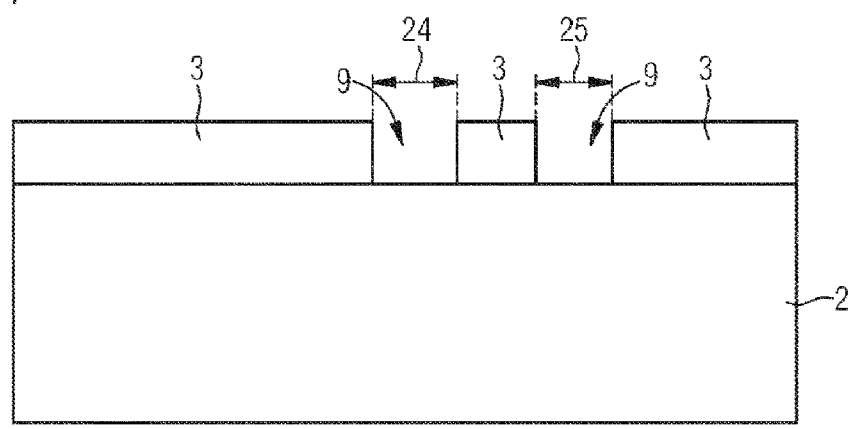

FIG. 14 shows a further embodiment of a semiconductor laser, in which further attachments 3 are provided laterally with respect to the attachment 3, but said further attachments are not electrically contacted, for example. The distances, i.e., the widths 24, 25 of the stepped graduations 9 are in the range of >0.1 μm, for example, >2 μm, preferably >10 μm.

Figure 15:
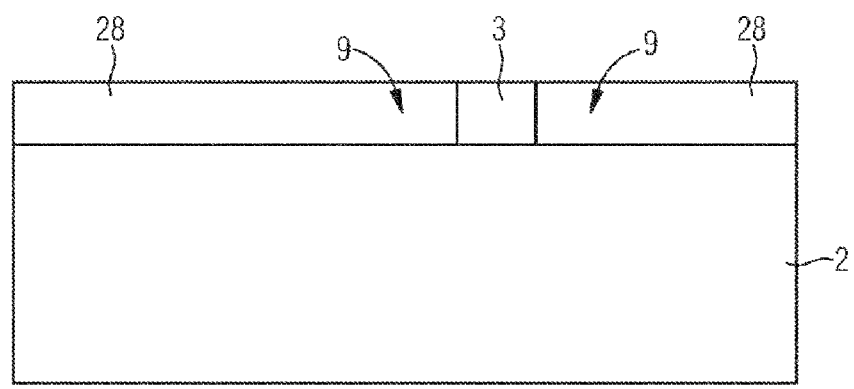

FIG. 15 shows a further embodiment of a semiconductor laser, in which the attachment 3 is laterally delimited by a stepped graduation 9 of the semiconductor material. Moreover, a filling material 26 is provided laterally with respect to the attachment 3, said filling material covering the main body 2 and, in the exemplary embodiment illustrated, having the same height as the attachment 3. Consequently, the stepped graduation 3 is embedded in a filling material 28. The example from FIG. 15 can constitute a buried heterostructure laser.

The invention claimed is:

1. A semiconductor laser comprising a layer structure comprising layers arranged one on top of another with at least the following layer sequence, the semiconductor laser comprising:
   an n-doped cladding layer;
   a third waveguide layer overlying the n-doped cladding layer;
   an active zone overlying the third waveguide layer, wherein light generating structures are arranged in the active zone;
   a second waveguide layer overlying the active zone;
   a blocking layer overlying the second waveguide layer;
   a first waveguide layer overlying the blocking layer; and
   a p-doped cladding layer overlying the first waveguide layer;
   wherein the first, second and third waveguide layers comprise at least $Al_xIn_yGa_{(1-x-y)}N$, where $0<x<1$, where $0<y<1$, and where $0<x+y<1$;
   wherein the blocking layer has an Al concentration that is at least 2% greater than the Al concentration of the first waveguide layer;
   wherein the blocking layer has an increase in Al concentration from the first waveguide layer in a direction toward the second waveguide layer; and
   wherein the blocking layer has a double-side stepped graduation, such that at least part of the blocking layer has a greater width than the first waveguide layer.

2. The semiconductor laser as claimed in claim 1, wherein the Al concentration increases proceeding from the first waveguide layer stepwise in the direction toward the second waveguide layer, wherein the blocking layer is subdivided into a first blocking layer and a second blocking layer, wherein the second blocking layer faces the first waveguide layer, wherein the first blocking layer faces the second waveguide layer, and wherein the Al concentration of the first blocking layer is at least 1% greater than the Al concentration of the second blocking layer.

3. The semiconductor laser as claimed in claim 2, wherein the double-side stepped graduation is arranged in a region of the second blocking layer or in a region of the first blocking layer.

4. The semiconductor laser as claimed in claim 2, wherein the first waveguide layer has a refractive index that on average is greater than that of the p-doped cladding layer, wherein the third waveguide layer has a refractive index that on average is greater than that of the n-doped cladding layer, and wherein the double-side stepped graduation is arranged in a region of the second blocking layer or in the region of the first blocking layer.

5. The semiconductor laser as claimed in claim 2, wherein the first blocking layer has a higher positive doping than the first waveguide layer, wherein the second blocking layer has a positive doping, wherein the doping of the first blocking layer is greater than the doping of the second blocking layer, wherein the doping of the second blocking layer is greater than or equal to the doping of the first waveguide layer, and wherein the doping of the second waveguide layer is less than the doping of the first waveguide layer.

6. The semiconductor laser as claimed in claim 2, wherein the first waveguide layer has a refractive index that on average is greater than that of the p-doped cladding layer, wherein the third waveguide layer has a refractive index that on average is greater than that of the n-doped cladding layer, wherein the first blocking layer has a higher positive doping than the first waveguide layer, wherein the second blocking layer has a positive doping, wherein the doping of the first blocking layer is greater than the doping of the second blocking layer, wherein the doping of the second blocking layer is greater than or equal to the doping of the first waveguide layer, and wherein in particular the doping of the second waveguide layer is less than the doping of the first waveguide layer.

7. The semiconductor laser as claimed in claim 2, further comprising an intermediate layer between the first blocking layer and second blocking layer.

8. The semiconductor laser as claimed in claim 1, wherein the first waveguide layer has a refractive index that on average is greater than that of the p-doped cladding layer, and wherein the third waveguide layer has a refractive index that on average is greater than that of the n-doped cladding layer.

9. The semiconductor laser as claimed in claim 1, wherein the Al concentration in the blocking layer increases linearly from the first waveguide layer in the direction toward the second waveguide layer.

10. The semiconductor laser as claimed in claim 1, wherein the double-side stepped graduation is arranged in a region of the second blocking layer or in a region of the first blocking layer, and wherein the Al concentration in the blocking layer increases linearly from the first waveguide layer in the direction toward the second waveguide layer.

11. The semiconductor laser as claimed in claim 1, wherein the first waveguide layer and the blocking layer are positively doped, wherein the doping of the blocking layer is greater than or equal to the doping of the first waveguide layer, and wherein any doping of the second waveguide layer is less than the doping of the first waveguide layer.

12. The semiconductor laser as claimed in claim 1, wherein the p-doped cladding layer has a doping that is greater than a doping of the first waveguide layer.

13. The semiconductor laser as claimed in claim 1, further comprising an intermediate layer between the first and second waveguide layers.

14. The semiconductor laser as claimed in claim 1, wherein the blocking layer comprises at least one AlGaN layer and/or an AlInGaN layer and/or an AlInN layer.

15. A semiconductor laser comprising a layer structure comprising layers arranged one on top of another with at least the following layer sequence, the semiconductor laser comprising:

an n-doped cladding layer;
a third waveguide layer overlying the n-doped cladding layer;
an active zone overlying the third waveguide layer, wherein light generating structures are arranged in the active zone;
a second waveguide layer overlying the active zone;
a blocking layer overlying the second waveguide layer;
a first waveguide layer overlying the blocking layer; and
a p-doped cladding layer overlying the first waveguide layer;
wherein the first, second and third waveguide layers comprise at least $Al_xIn_yGa_{(1-x-y)}N$, where $0<x<1$, where $0<y<1$, and where $0<x+y<1$;
wherein the blocking layer has an Al concentration that is at least 2% greater than the Al concentration of the first waveguide layer;
wherein the blocking layer has an increase in Al concentration from the first waveguide layer in a direction toward the second waveguide layer;
wherein the blocking layer has a double-side stepped graduation, such that at least part of the blocking layer has a greater width than the first waveguide layer;
wherein the Al concentration increases proceeding from the first waveguide layer stepwise in a direction toward the second waveguide layer;
wherein the blocking layer is subdivided into a first blocking layer and a second blocking layer;
wherein the second blocking layer faces the first waveguide layer and the first blocking layer faces the second waveguide layer;
wherein the Al concentration of the first blocking layer is at least 1% greater than the Al concentration of the second blocking layer; and
wherein the double-side stepped graduation is arranged in a region of the second blocking layer or in a region of the first blocking layer.

16. A method for producing a semiconductor laser comprising a layer structure comprising layers arranged one on top of another along a Y-axis, wherein the layers extend in planes that are defined by a Z-axis and an X-axis, wherein the X-axis, Z-axis and Y-axis are each perpendicular to one another, wherein the Y-axis identifies a height, the X-axis identifies a width and the Z-axis identifies a length of the layer structure, the method comprising:

forming an n-doped cladding layer;
forming a third waveguide layer over the n-doped cladding layer;
forming an active zone over the third waveguide layer, wherein light generating structures are arranged in the active zone;
forming a second waveguide layer over the active zone;
forming a blocking layer over the second waveguide layer;
forming a first waveguide layer over the blocking layer; and
forming a p-doped cladding layer over the first waveguide layer; layer;
wherein the first, second and third waveguide layers comprise at least $Al_xIn_yGa_{(1-x-y)}N$, where $0<x<1$, where $0<y<1$, and where $0<x+y<1$;
wherein the first waveguide layer is provided with a refractive index that on average is greater than that of the p-doped cladding layer;
wherein the third waveguide layer is provided with a refractive index that on average is greater than that of the n-doped cladding layer;

wherein the blocking layer is provided with an Al concentration that is at least 2% greater than an Al concentration of the first waveguide layer;

wherein the blocking layer is provided with an increase in the Al concentration from the first waveguide layer in a direction toward the second waveguide layer;

wherein the layer structure in the Y/X-plane is provided with a double-side, symmetrical stepped graduation; and wherein the blocking layer has a double-side stepped graduation adjoining the blocking layer or in the blocking layer, such that at least one part of the blocking layer has a greater width than the first waveguide layer.

17. The method as claimed in claim 16, wherein the Al concentration increases proceeding from the third waveguide layer stepwise in the direction toward the second waveguide layer, wherein the blocking layer is subdivided into a first and a second blocking layer, wherein the second blocking layer faces the first waveguide layer, wherein the first blocking layer faces the second waveguide layer, and wherein the first blocking layer is provided with at least 1% more aluminum than the second blocking layer.

18. The method as claimed in claim 17, wherein the double-side stepped graduation is arranged in a region of the first blocking layer or the second blocking layer.

19. The method as claimed in claim 17, wherein the double-side stepped graduation is arranged in a region of the first blocking layer or the second blocking layer, wherein the Al concentration in the blocking layer is increased linearly, proceeding from the first waveguide layer in the direction of the second waveguide layer.

20. The method as claimed in claim 16, wherein the Al concentration in the blocking layer is increased linearly proceeding from the first waveguide layer in the direction of the second waveguide layer.

* * * * *